(12) United States Patent
Haskell et al.

(10) Patent No.: US 8,450,192 B2
(45) Date of Patent: May 28, 2013

(54) GROWTH OF PLANAR, NON-POLAR, GROUP-III NITRIDE FILMS

(75) Inventors: Benjamin A. Haskell, Santa Barbara, CA (US); Paul T. Fini, Santa Barbara, CA (US); Shigemasa Matsuda, Tokyo (JP); Michael D. Craven, San Jose, CA (US); Steven P. DenBaars, Goleta, CA (US); James S. Speck, Goleta, CA (US); Shuji Nakamura, Santa Barbara, CA (US)

(73) Assignees: The Regents of the University of California, Oakland, CA (US); Japan Science and Technology Center, Saitama Prefecture (JP)

( * ) Notice: Subject to any disclaimer, the term of this patent is extended or adjusted under 35 U.S.C. 154(b) by 35 days.

(21) Appl. No.: 12/207,407

(22) Filed: Sep. 9, 2008

(65) Prior Publication Data

US 2009/0001519 A1 Jan. 1, 2009

Related U.S. Application Data

(63) Continuation of application No. 10/537,385, filed as application No. PCT/US03/21916 on Jul. 15, 2003, now Pat. No. 7,427,555.

(60) Provisional application No. 60/433,844, filed on Dec. 16, 2002, provisional application No. 60/433,843, filed on Dec. 16, 2002.

(51) Int. Cl.
*H01L 29/20* (2006.01)
*H01L 21/203* (2006.01)

(52) U.S. Cl.
USPC ............ 438/483; 438/41; 438/46; 257/615; 257/11; 257/12; 257/E21.108; 257/E21.121

(58) Field of Classification Search
USPC ...... 117/99; 257/E21.108, E21.121, E29.097, 257/615, 11, 14; 438/478, 41, 46, 48
See application file for complete search history.

(56) References Cited

U.S. PATENT DOCUMENTS

| | | | |
|---|---|---|---|
| 5,926,726 A | 7/1999 | Bour et al. | |
| 6,051,849 A | 4/2000 | Davis et al. | |
| 6,072,197 A | 6/2000 | Horino et al. | |
| 6,086,673 A | 7/2000 | Molnar | |
| 6,153,010 A * | 11/2000 | Kiyoku et al. ................ | 117/95 |

(Continued)

FOREIGN PATENT DOCUMENTS

| | | |
|---|---|---|
| EP | 0942459 | 9/1999 |
| EP | 1091422 | 11/2001 |

(Continued)

OTHER PUBLICATIONS

Maruska, H.P. et al., "Development of 50 mm Diameter Non-Polar Gallium Nitride Substrates for Device Applications", International Conference on Indium Phosphide and Related Materials, May 16, 2003, pp. 567-570.

(Continued)

*Primary Examiner* — Thinh T Nguyen
(74) *Attorney, Agent, or Firm* — Gates & Cooper LLP

(57) ABSTRACT

Growth methods for planar, non-polar, Group-III nitride films are described. The resulting films are suitable for subsequent device regrowth by a variety of growth techniques.

22 Claims, 7 Drawing Sheets

U.S. PATENT DOCUMENTS

| | | | |
|---|---|---|---|
| 6,156,581 A * | 12/2000 | Vaudo et al. | 438/22 |
| 6,177,057 B1 | 1/2001 | Purdy | |
| 6,177,292 B1 | 1/2001 | Hong et al. | |
| 6,180,270 B1 | 1/2001 | Cole et al. | |
| 6,218,280 B1 | 4/2001 | Kryliouk et al. | |
| 6,268,621 B1 | 7/2001 | Emmi et al. | |
| 6,350,666 B2 | 2/2002 | Kryliouk | |
| 6,399,966 B1 * | 6/2002 | Tsuda et al. | 257/103 |
| 6,413,627 B1 | 7/2002 | Motoki et al. | |
| 6,440,823 B1 | 8/2002 | Vaudo et al. | |
| 6,441,391 B1 | 8/2002 | Ohno et al. | |
| 6,468,882 B2 | 10/2002 | Motoki et al. | |
| 6,518,082 B1 | 2/2003 | Kidoguchi et al. | |
| 6,582,986 B2 | 6/2003 | Kong et al. | |
| 6,586,316 B2 | 7/2003 | Tsuda et al. | |
| 6,599,362 B2 | 7/2003 | Ashby et al. | |
| 6,602,763 B2 | 8/2003 | Davis et al. | |
| 6,623,560 B2 | 9/2003 | Biwa et al. | |
| 6,627,551 B2 | 9/2003 | Johji et al. | |
| 6,635,901 B2 | 10/2003 | Sawaki et al. | |
| 6,645,295 B1 | 11/2003 | Koike et al. | |
| 6,847,057 B1 | 1/2005 | Gardner et al. | |
| 6,900,070 B2 | 5/2005 | Craven et al. | |
| 6,969,426 B1 | 11/2005 | Bliss et al. | |
| 7,057,211 B2 * | 6/2006 | Dwilinski et al. | 257/97 |
| 7,091,514 B2 * | 8/2006 | Craven et al. | 257/14 |
| 2001/0029086 A1 | 10/2001 | Ogawa et al. | |
| 2002/0028564 A1 | 3/2002 | Motoki et al. | |
| 2002/0047113 A1 | 4/2002 | Ohno et al. | |
| 2002/0056846 A1 * | 5/2002 | Tsuda et al. | 257/86 |
| 2003/0114017 A1 | 6/2003 | Wong et al. | |
| 2003/0198837 A1 | 10/2003 | Craven et al. | |
| 2004/0108513 A1 | 6/2004 | Narukawa et al. | |
| 2004/0251471 A1 | 12/2004 | Dwilinski et al. | |
| 2004/0261692 A1 | 12/2004 | Dwilinski et al. | |
| 2005/0205884 A1 | 9/2005 | Kim et al. | |
| 2006/0138431 A1 | 6/2006 | Dwilinski et al. | |

FOREIGN PATENT DOCUMENTS

| | | |
|---|---|---|
| EP | 1249522 | 10/2002 |
| EP | 1385196 | 1/2004 |
| JP | 63-178516 | 7/1988 |
| JP | 03-003233 | 1/1991 |
| JP | 03-3233 | 1/1991 |
| JP | 11-001399 | 1/1999 |
| JP | 2000-012900 | 1/2000 |
| JP | 2000-068609 | 3/2000 |
| JP | 2001-007394 | 1/2001 |
| JP | 2001-160656 | 6/2001 |
| JP | 2001257166 | 9/2001 |
| JP | 2001342100 | 11/2001 |
| JP | 2002076329 | 3/2002 |
| JP | 2002076521 | 3/2002 |
| JP | 2002-324758 | 11/2002 |
| JP | 2006-514780 | 5/2006 |
| JP | 2000-223418 | 8/2012 |
| KR | 10-0239497 | 10/1999 |
| KR | 10-2001-0075149 | 8/2001 |
| WO | 03/089694 | 10/2003 |
| WO | 2004/061969 | 7/2004 |
| WO | 2004061969 | 7/2004 |
| WO | 2005/064643 | 7/2005 |

OTHER PUBLICATIONS

Dupuis, R.D., et al., "Selective-area and lateral epitaxial overgrowth of III-N materials by metalorganic chemical vapor deposition", Journal of Crystal Growth, vol. 195, No. 1-4, Dec. 15, 1998, pp. 340-345, XP004154285.

Grzegory, I., et al., "Seeded growth of GaN at high $N_2$ pressure on (0 0 0 1) polar surfaces of GaN single crystalline substrates", Materials Science in Semiconductor Processing, vol. 4, No. 6, Dec. 2001, pp. 535-541, XP004345737.

Liu, L. et al., "Substrates for gallium nitride epitaxy", Materials Science and Engineering R, Reports: A Review Journal, vol. 37, No. 3, Apr. 30, 2002, pp. 61-127, XP004349792.

Marchand, H., et al., "Mechanisms of lateral epitaxial overgrowth of gallium nitride by metalorganic chemical vapor deposition", Journal of Crystal Growth, vol. 195, No. 1-4, Dec. 15, 1998, pp. 328-332, XP004154283.

Mills, Alan, "Wide-bandgap emitters continue to improve", III-Vs Review, vol. 13, No. 3, May 2000, pp. 23-24, 26, 28-30, XP004200697.

Sasaki, T., et al., "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.

Sun, Chien-Jen, et al., "Comparison of the physical properties of GaN thin films deposited on (0001) and (0112) sapphire substrates", Applied Physics Letters, vol. 63, No. 7, 1993, pp. 973-975, XP002251480.

Amano, H., et. al., "Metalorganic vapor phase epitaxial growth of a high quality GaN film using an AlN buffer layer" Appl. Phys. Lett. 48 (5), Feb. 3, 1986, pp. 353-355.

Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.

Bottcher, T., et al., "The role of high-temperature island coalescence in the development of stresses in GaN films" Appl. Phys. Lett. 78 (14), Apr. 2, 2001, pp. 1976-1978.

Brandt, O., et al., "Determination of strain state and composition of highly mismatched group-III nitride heterostructures by x-ray diffraction" J. Phys. D. Appl. Phys. 35 (2002), pp. 577-585.

Craven, M.D., et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.

Craven, M.D., et al., "Structural characterization of nonpolar (1120) α-plane GaN thin films grown on (1102) r-plane sapphire", Applied Physics Letters, vol. 81, No. 3, Jul. 15, 2002, pp. 469-471, XP002250684.

Craven, M.D., et al., "Threading dislocation reduction via laterally overgrown nonpolar (1120) a-plane GaN" Appl. Phys. Lett. 81 (7), Aug. 12, 2002, pp. 1201-1203.

Dovidenko, K., et. al., Characteristics of stacking faults in AlN thin films J. Appl. Phys. 82 (9), Nov. 1, 1997, pp. 4296-4299.

Eastman, L.F., "The Toughest Transistor Yet" IEEE Spectrum 39 (5), May 2002, pp. 28-33.

Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-455.

Etzkorn, E.V., et al., "Cracking of GaN films" J. Appl. Phys. 89 (2), Jan. 15, 2001, pp. 1025-1034.

Freitas, J. A., Jr., et al., "Optical characterization of lateral epitaxial overgrown GaN layers" Appl. Phys. Lett. 72 (23), Jun. 8, 1998, pp. 2990-2992.

Grandjean, N., et al., "Built-in electric-field effects in wurtzite AlGaN quantum wells" J. Appl. Phys. 86 (7), Oct. 1, 1999, pp. 3714-3720.

Heying, B., et al., "Role of threading dislocation structure on the x-ray diffraction peak widths in epitaxial GaN films" Appl. Phys. Lett. 68 (5), Jan. 29, 1996, pp. 643-645.

I. J. Seo, et. al., "Reduction of oscillator strength due to piezoelectric fields in $GaN/Al_xGa_{1-x}N$ quantum wells" Phys. Rev. B. 57 (16), Apr. 15, 1998—II, pp. R9435-R9438.

Iwata, K., et. al., "Gas Source Molecular Beam Epitaxy Growth of GaN on C-, A-, R-, and M-Plane Sapphire and Silica Glass Substrates" Jpn. J. Appl. Phys. vol. 36 (1997), pp. L661-L664.

Kapolnek, D., et al., "Anisotropic epitaxial lateral growth in GaN selective area epitaxy" Appl. Phys. Lett. 71 (9), Sep. 1, 1997, pp. 1204-1206.

Langer, R., et. al., "Giant electric fields in unstrained GaN single quantum wells" Appl. Phys. Lett., 74 (25), Jun. 21, 1999, pp. 3827-3829.

Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.

Lefebvre, P., et al., "Time-resolved photoluminescence as a probe of internal electric fields in GaN-(GaAl)N quantum wells" Phys. Rev. B. 59 (23), Jun. 15, 1999—I, pp. 15363-15367.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1991—I, pp. 1496-1499.

Leszczynski, M., et. al., "Lattice parameters of gallium nitride" Appl. Phys. Lett. 69 (1), Jul. 1, 1996, pp. 73-75.

Marchand, H., et al., "Microstructure of GaN laterally overgrown by metalorganic chemical vapor deposition" Appl. Phys. Lett.. 73 (6), Aug. 10, 1998, pp. 747-749.

Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.

Metzger, Th., et. al., "X-Ray Diffraction Study of Gallium Nitride Grown by MOCVD" Physica status solidi (b) 193, 1996, pp. 391-397.

B. Monemar, et. al., "Properties of Zn-doped VPE-grown GaN.I. Luminescence data in relation to doping conditions" J. Appl. Phys. 51 (1), Jan. 1980, pp. 625-639.

Moustakas, T.D., et. al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.

Nakamura, S, et. al., "Violet InGaN/GaN/AlGaN-Based Laser Diodes Operable at 50° C with a Fundamental Transverse Mode" Jpn. J. Appl. Phys. 38 (2), 1999, pp. L226-L229.

Nam, O., et. al., "Lateral epitaxy of low defect density GaN layers via organometallic vapor phase epitaxy" Appl. Phys. Lett. 71 (18), Nov. 3, 1997, pp. 2638-2640.

Nataf, G., et. al., "Lateral overgrowth of high quality GaN layers on GaN/$Al_2O_3$ patterned substrates by halide vapour-phase epitaxy" J. of Crystal Growth (192), Feb. 20, 1998, pp. 73-78.

Ng, H. M., "Molecular-beam epitaxy of GaN/$Al_xGa_{1-x}$N multiple quantum wells on R-plane (1012) sapphire substrates" Appl. Phys. Lett. 80 (23), Jun. 10, 2002, pp. 4369-4371.

Nishida, T., et al., "Ten Milliwatt Operation of an AlGaN-Based Light Emitting Diode Grown on GaN Substrate" Phys. Stat. Sol. (a) 188 (1), 2001, pp. 113-116.

Park, S., et. al., "Spontaneous polarization effects in wurtzite GaN/AlGaN quantum wells and comparison with experiment" Appl. Phys. Lett. 76 (15), Apr. 10, 2000, pp. 1981-1983.

Park, J., et. al., "Selective-area and lateral epitaxial overgrowth of III-N materials by metal organic chemical vapor deposition" Appl. Phys. Lett. 73 (3), Jul. 20, 1998, pp. 333-335.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Rosner, S.J., et. al., "Cathodoluminescence mapping of epitaxial lateral overgrowth in gallium nitride" Appl. Phys. Lett. 74 (14), Apr. 5, 1999, pp. 2035-2037.

Sakai, A., et al., "Self-organized propagation of dislocations in GaN films during epitaxial lateral overgrowth" Appl. Phys. Lett 76 (4), Jan. 24, 2000, pp. 442-444.

Sano, M., et al., "Epitaxial Growth of Undoped and Mg-Doped GaN" Jpn. J. of Appl. Phys. 15 (10), Oct. 1976, pp. 1943-1950.

Shintani, A., et al. "Light Emitting Patterns of Gallium Nitride Electroluminescence" J. Electrochem. Soc. 123 (10), Oct. 1976, pp. 1575-1578.

Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Takeuchi, T., et. al., "Determination of piezoelectric fields in strained GaInN quantum wells using the quantum-confined Stark effect" Appl. Phys. Lett. 73 (12), Sep. 21, 1998, pp. 1691-1693.

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-L385.

Tan, I-H., et. al., "A self consistent solution of Schrodinger-Poisson equations using a nonuniform mesh" J. Appl. Phys. 68 (8), Oct. 15, 1990, pp. 4071-4076.

Tsuchiya, H., et al., "Growth condition dependence of GaN crystal structure on (0 0 1)GaAs by hydride vapor-phase epitaxy" J. of Crystal Growth (189/190), 1998, pp. 395-400.

Waltereit, P., et. al., "Nitride semiconductors free of electrostatic fields for efficient white light-emitting diodes" Nature vol. 406, Aug. 24, 2000, pp. 865-868.

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6$^{th}$ International Conference, Oct. 2001, vol. 2, pp. 1998-1201.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lasing Threshold Current Density by the Lowering of Valence Band Effective Mass" J. of Lightwave Tech. vol. LT-4 (5), May 1986, pp. 504-506.

Zheleva, T., et. al., "Dislocation density reduction via lateral epitaxy in selectively grown GaN structures" Appl. Phys. Lett. 71 (17), Oct. 27, 1997, pp. 2472-2474.

Zheleva, T., et. al., "Pendo-epitaxy—A new approach for lateral growth of gallium nitride structures" MRS Internet J. Nitride Semicond. Res. 4S1, G3.38 (1999).

Yu., Z., et. al., "Epitaxial lateral overgrowth of GaN on SiC and sapphire substrates" MRS Internet J. Nitride Semicond. Res. 4S1, G4.3 (1999).

Kinoshita et al, "Emission Enhancement of GaN/AlGaN Single-Quantum-Wells Due to Screening of Piezoelectric Field", MRS Internet J. Nitride Semicond. Res. 5, W11.32 (2000).

Leroux et al., "Quantum confined Stark effect due to built-in internal polarization fields in (Al,Ga)N/GaN quantum wells", Phys. Rev. B 58, R113371 (1998).

Kuokstis et al., "Polarization effects in photoluminescence of C- and M-plane GaN/AlGaN multiple quantum wells", Appl. Phys. Lett. 81, 4130 (2002).

Bhattacharyya et la., "Comparative study of GaN/AlGaN MQWs grown homoepitaxially on (1 1 0 0) and (0001) GaN", Crystal Growth 251, 487 (2003).

Bernardini et al., "Spontaneous polarization and piezoelectric constants of III-V nitrides", Phys. Rev. B 56, R10024 (1997).

Langer et al., "Giant electric fields in unstrained GaN single quantum wells", Appl. Phys. Lett. 74, 3827 (1999).

Traetta et al., "Effects of the spontaneous polarization and piezoelectric fields on the luminescence spectra of GaN/$Al_{0.15}Ga_{0.85}$N quantum wells", Physica E 7, 929-933 (2000).

Keller et al., "Metalorganic Chemical Vapor Deposition Growth of High Optical Quality and High Mobility GaN", J. Electronic Materials vol. 24, pp. 1707-1709 (1995).

Chakraborty et al., "Nonpolar InGaN/GaN emitters on reduced-defect lateral epitaxially overgrown a-plane GaN with drive-current-independent electroluminescence emission peak", Applied Physics Letters vol. 85 No. 22, (Nov. 29, 2004).

Chitnis et al., "Visible light-emitting diodes using a-plane GaN-InGaN multiple quantum wells over r-plane sapphire", Applied Physics Letters vol. 84 No. 18 (May 3, 2004).

Gardner et al., "Polarization anisotropy in the electroluminescence of m-plane InGaN-GaN multiple-quantum-well light-emitting diodes", Applied Physics Letters 86, 111101 (2005).

Vanfleet et al., "Defects in m-face GaN films grown in halide vapor phase epitaxy on $LiAlO_2$", Applied Physics Letters, vol. 83 No. 6 (Aug. 11, 2003).

Haskell et al., "Defect reduction in (1120) a-plane gallium nitride via lateral epitaxial overgrowth by hydride vapor-phase epitaxy", Applied Physics Letters, vol. 83 No. 4 (Jul. 28, 2003).

Yue Jun Sun et al., "In surface segregation in M-plane (In,Ga)N/GaN multiple quantum well structures", Applied Physics Letters, vol. 83 No. 25 (Dec. 22, 2003).

Bigenwald et al., "Confined Excitons in GaN-AlGaN Quantum Wells", Phys. Stat. Sol. (b) 216, 371 (1999).

Im, J.S. et al., "Reduction of oscillator strength due to piezoelectric fields in GaN/$Al_xGa_{1-x}$N quantum wells", Phys. Rev. B, vol. 57 No. 16 (Apr. 15, 1998).

Nam, Ok-Hyun et al., "Lateral epitaxy of low defect density GaN layers via organometallic vapor phase epitaxy", Appl. Phys. Lett. 71 (18) (Nov. 3, 1997).

Zheleva et al., "Dislocation density reduction via lateral epitaxy in selectively grown GaN structures", Appl. Phys. Lett. 71 (17) (Oct. 27, 1997).

Yue Jun Sun et al., "Nonpolar $In_xGa_{1-x}$N/GaN(1100) multiple quantum wells grown on γ-$LiAlO_2$(100) by plasma-assisted molecular-beam epitaxy", Physical Review B 67 (2003).

Takeuchi et al., "Theoretical Study of Orientation Dependence of Piezoelectric Effects in Wurtzite Strained GaInN/GaN Heterostructures and Quantum Wells", Jpn. J. Appl. Phys. vol. 39, pp. 413-416, Part 1, No. 2A (Feb. 2000).

Grandjean et al., "Self-limitation of AlGaN/GaN quantum well energy by built-in polarization field", Applied Physics Letters, vol. 74, No. 16 (Apr. 19, 1999).

Amano et la., "Stress and Defect Control in GaN Using Low Temperature Interlayers", Jpn. J. Appl. Phys., vol. 37 (1998).

Mukai et al., "Ultraviolet InGaN and GaN Single-Quantum-Well-Structure Light-Emitting Diodes Grown on Epitaxially Laterally Overgrown GaN Substrates", Jpn. J. Appl. Phys., vol. 38, pp. 5735-5739 (1999).

Miller et al., "Electric field dependence of optical absorption near the band gap of quantum-well structures", The American Physical Society, Physical Review B, vol. 32, No. 2 (Jul. 15, 1985).

Gu, S. et al., "The Impact of Initial Growth and Substrate Nitridation on Thick GaN Growth on Sapphire by Hydride Vapor Phase Epitaxy," Journal of Crystal Growth, vol. 231, No. 3, Oct. 2001, pp. 342-351.

Pearton et al., "GaN: Processing, defects, and devices", Applied Physics Reviews, Journal of Applied Physics, vol. 86, No. 1 (Jul. 1, 1999).

Nakamura, S. et al., The Blue Laser Diode, (Springer, Heidelberg, 1997), pp. 160-178.

Nichizuka, K., "Efficient Radiative Recombination From <1122>-oriented InxGa1-xN Multiple Quantum Wells Fabricated by the Regrowth Technique," Applied Physics Letters, Oct. 2004, vol. 85, No. 15, pp. 3122-3124, abstract.

Sharma, R., "Demonstration of a Semipolar (1013) InGaN/GaN Green Light Emitting Diode," Applied Physics Letters, Nov. 2005, vol. 87, 231110, pp. 1-3, abstract.

Waltereit et al., "M-Plane GaN(1 1 0 0) Grown on γ-$LiAlO_2$(1 0 0): Nitride Semiconductors Free of Internal Electrostatic Fields," Journal of Crystal Growth 227-228 (2001), pp. 437-441.

Ajoul et al., "Hydrogen and Nitrogen Ambient Effects on Epitaxial Growth of GaN by Hydride Vapour Phase Epitaxy," Journal of Crystal Growth 230 (2001), pp. 372-376.

Amano, H. et al., "Stress and Defect Control in GaN Using Low Temperature Interlayers," Jpn. J. Appl. Phys. vol. 37 (1998), pp. L 1540-L 1542.

Korean Office Action (with translation) dated Jun. 29, 2012 for Korean Divisional Application No. 2011-7018407.

Japanese Written Questioning dated Jul. 26, 2011, Patent Application No. 2004-564675, with translation.

KR Office Action dated Sep. 7, 2011, Application No. 10-2011-7018407.

EP Office Action date Dec. 9, 2001, Application No. 03 790 447.1.

Chen, C. et al., "Ultraviolet light emitting diodes using non-polar a-plane GaN-AlGaN multiple quantum wells," Jpn. J. Appl. Phys., vol. 42, No. 9A/B, Sep. 15, 2003, pp. L1039-L1040.

Sun, W. et al., "Strong ultraviolet emission from non-polar AlGaN/GaN quantum wells grown over r-plane sapphire substrates," Phys. Stat. Sol. (a), vol. 200, No. 1, Nov. 2003, pp. 48-51.

Chen, C. et al., "GaN homoepitaxy on freestanding (1100) oriented GaN substrates," Applied Physics Letters, vol. 81, No. 17, Oct. 21, 2002, 3194.

JP Office Action dated Sep. 6, 2011, Patent Application No. 2008-514783.

TW Decision dated Oct. 25, 2011, Application No. 092135556 (w/ translation).

EP Communication dated Jan. 12, 2011, Application No. 03790447.1.

TW Office Action dated Feb. 16, 2012, Application No. 099131879 (w/ translation).

TW Office Action dated Mar. 9, 2011, TW application No. 092135556, with translation.

Japanese Office Action dated Sep. 18, 2012, Application No. 2009-224861, with English translation.

Japanese Office Action dated Sep. 11, 2012, Application No. 2010-19516, with English translation.

European Communication dated Sep. 12, 2012, Application No. 038145710.

Japanese Office Action dated Sep. 11, 2012, Application No. 2004-564675, with English translation [corrected application number].

* cited by examiner

GROWTH OF PLANAR, NON-POLAR, GROUP-III NITRIDE FILMS

CROSS-REFERENCE TO RELATED APPLICATIONS

This application is a continuation of and claims the benefit under 35 U.S.C. §120 of U.S. Utility patent application Ser. No. 10/537,385, filed on Jun. 3, 2005, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR GALLIUM NITRIDE BY HYDRIDE VAPOR PHASE EPITAXY," which application claims the benefit under 35 U.S.C. §365(c) of PCT International Application No. PCT/US03/21916, filed on Jul. 15, 2003, by Benjamin A. Haskell, Michael D. Craven, Paul T. Fini, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY," which application claims priority to and the benefit under 35 U.S.C. §119(e) of U.S. Provisional Patent Application Ser. No. 60/433,843, filed on Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY," and U.S. Provisional Application Ser. No. 60/433,844, filed on Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY," all of which applications are incorporated by reference herein.

This application is related to co-pending and commonly-assigned U.S. Utility patent application Ser. No. 11/670,332, filed on Feb. 1, 2007, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE," which application is a continuation of and claims the benefit under 35 U.S.C. §120 of U.S. Utility Pat. No. 7,220,658, issued on May 22, 2007, to Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY," which patent claims the benefit under 35 U.S.C. §365(c) of PCT International Application No. PCT/US03/21918, filed on Jul. 15, 2003, by Benjamin A. Haskell, Michael D. Craven, Paul T. Fini, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY," which application claims priority to and the benefit under 35 U.S.C. §119(e) of U.S. Provisional Patent Application Ser. No. 60/433,843, filed on Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY," and U.S. Provisional Application Ser. No. 60/433,844, filed on Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY," all of which applications are incorporated by reference herein.

FIELD OF THE INVENTION

The invention is related to semiconductor materials, methods, and devices, and more particularly, to the growth of planar, non-polar, a-plane gallium nitride (GaN) by hydride vapor phase epitaxy (HVPE).

DESCRIPTION OF THE RELATED ART (Note: This application references a number of different patents, applications and/or publications as indicated throughout the specification by one or more reference numbers. A list of these different publications ordered according to these reference numbers can be found below in the section entitled "References." Each of these publications is incorporated by reference herein.)

The usefulness of gallium nitride (GaN) and its ternary and quaternary compounds incorporating aluminum and indium (AlGaN, InGaN, AlInGaN) has been well established for fabrication of visible and ultraviolet optoelectronic devices and high-power electronic devices. (See References 1-3.) These devices are typically grown epitaxially by growth techniques including molecular beam epitaxy (MBE), metalorganic chemical vapor deposition (MOCVD), or hydride vapor phase epitaxy (HVPE).

GaN and its alloys are most stable in the hexagonal würtzite crystal structure, in which the crystal is described by two (or three) equivalent basal plane axes that are rotated 120° with respect to each other (the a-axes), all of which are perpendicular to a unique c-axis. FIG. 1 is a schematic of a generic hexagonal würtzite crystal structure 100 and planes of interest 102, 104, 106, 108 with these axes 110, 112, 114, 116 identified therein.

As a consequence of the gallium and nitrogen atom positions within the würtzite structure, as one proceeds from plane to plane along the c-axis, each plane will contain only one type of atoms, either Ga or N. In order to maintain charge neutrality, GaN crystals terminate with one c-face that contains only nitrogen atoms (the N-face), and one c-face that only contains gallium atoms (the Ga-face). As a consequence, GaN crystals are polarized along the c-axis. The spontaneous polarization of these crystals is a bulk property and depends on the structure and composition of the crystal.

Due to the relative ease of growing planar Ga-face c-planes, virtually all GaN-based devices are grown parallel to the polar c-axis. Furthermore, strain at interfaces between adjacent dissimilar layers gives rise to piezoelectric polarization. The total polarization is a sum of the spontaneous and piezoelectric contributions, the net effect of which causes charge separation within quantum heterostructures. Charge separation within quantum wells decreases the electron-hole recombination efficiency and red-shifts the emission wavelength [4-8], both of which are undesirable in the operation of the operation of light-emitting optoelectronic devices. It is believed that the efficiency of GaN light emitting devices would be enhanced were it possible to eliminate the polarization effects inherent to c-axis oriented devices.

One possible approach to eliminating the piezoelectric polarization effects in GaN optoelectronic devices is to grow the devices on non-polar planes of the crystal. (See References 9-11.) Such planes contain equal numbers of Ga and N atoms and are charge-neutral. Furthermore, subsequent non-polar layers are equivalent to one another so the bulk crystal will not be polarized along the growth direction. One such family of symmetry-equivalent non-polar planes in GaN is the {11$\bar{2}$0} family, known collectively as a-planes. Growth on electronic devices, such as high electron mobility transistors; or optoelectronic devices, such as visible and ultraviolet laser diodes and light-emitting diodes; on a-plane substrates could yield significantly enhanced device performance compared to equivalent devices grown on c-plane GaN.

Bulk crystals of GaN are not available so it is not possible to simply cut a crystal to present a surface for subsequent device regrowth. Commonly, GaN films are initially grown heteroepitaxially, i.e. on foreign substrates that provide a reasonable lattice match to GaN. In recent years, a number of research groups have found it possible to utilize HVPE as a means of heteroepitaxially depositing GaN films that are thick enough (>200 μm) to remove the foreign substrate, yielding a free-standing GaN substrate that may then be used for homoepitaxial device regrowth. (See References 12-13.) HVPE has the advantage of growth rates that are one to two orders of magnitude greater than that of MOCVD and as many as three orders of magnitude greater than MBE, which is an advantage that makes it attractive for substrate fabrication.

However, to date, it has only been possible to grow planar c-plane GaN films by HVPE. In the case of a-plane GaN, films grown by virtually every technique exhibit a "sawtooth" or highly faceted morphology (see References 13-15), such as is shown in FIG. 2, which is a cross-sectional scanning electron micrograph (SEM) image of a conventionally-grown a-plane GaN film. Such a surface structure is clearly unacceptable for use as either a substrate or device layer material.

Thus, there is a need in the art for methods of growing high-quality thick films of a-plane GaN suitable for use as substrates in homoepitaxial device layer regrowth. More specifically, there is a need in the art for methods of growing highly planar, specular a-plane GaN films. The present invention satisfies this need.

SUMMARY OF THE INVENTION

The present invention discloses a method for forming a planar, non-polar, a-plane gallium nitride (GaN) film on a substrate, comprising: (a) loading a substrate into a reactor; (b) evacuating the reactor and backfilling the reactor with purified nitrogen ($N_2$) gas to reduce oxygen levels therein; (c) heating the reactor to a growth temperature of approximately 1040° C., with a mixture of hydrogen ($H_2$) and nitrogen ($N_2$) flowing through all channels in the reactor; (d) nitridating the substrate by adding anhydrous ammonia ($NH_3$) to a gas stream in the reactor to nitridate the substrate; (e) reducing the reactor's pressure to a desired deposition pressure, wherein the desired deposition pressure is approximately 76 Torr; (f) initiating a gaseous hydrogen chloride (HCl) flow to a gallium (Ga) source to begin growth of the a-plane GaN film directly on the substrate, wherein the gaseous HCl reacts with the Ga at a temperature in excess of 600° C. to form gallium monochloride (GaCl); (g) transporting the GaCl to the substrate using a carrier gas that includes at least a fraction of hydrogen ($H_2$), wherein the GaCl reacts with ammonia ($NH_3$) at the substrate to form the GaN film; and (h) after a desired growth time has elapsed, interrupting the gaseous HCl flow, returning the reactor's pressure to atmospheric pressure, reducing the reactor's temperature to room temperature, and including anhydrous ammonia ($NH_3$) in a gas stream to prevent decomposition of the GaN film during the reduction of the reactor's temperature.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention uses hydride vapor phase epitaxy (HVPE) to grow planar, non-polar, a-plane gallium nitride (GaN) films. Specifically, the present invention relies on the use of a combination of several growth parameters to achieve these planar, non-polar, a-plane gallium nitride (GaN) films:

1. The use of a suitable substrate, such as, but not limited to, an r-plane sapphire ($Al_2O_3$) substrate.

2. The use of a fraction of hydrogen ($H_2$) as a carrier gas for the final growth stage in one or more of the gas streams in a reactor.

3. A reduced reactor pressure, below atmospheric pressure (760 Torr), for the film deposition step.

Process Steps

Figure 1:
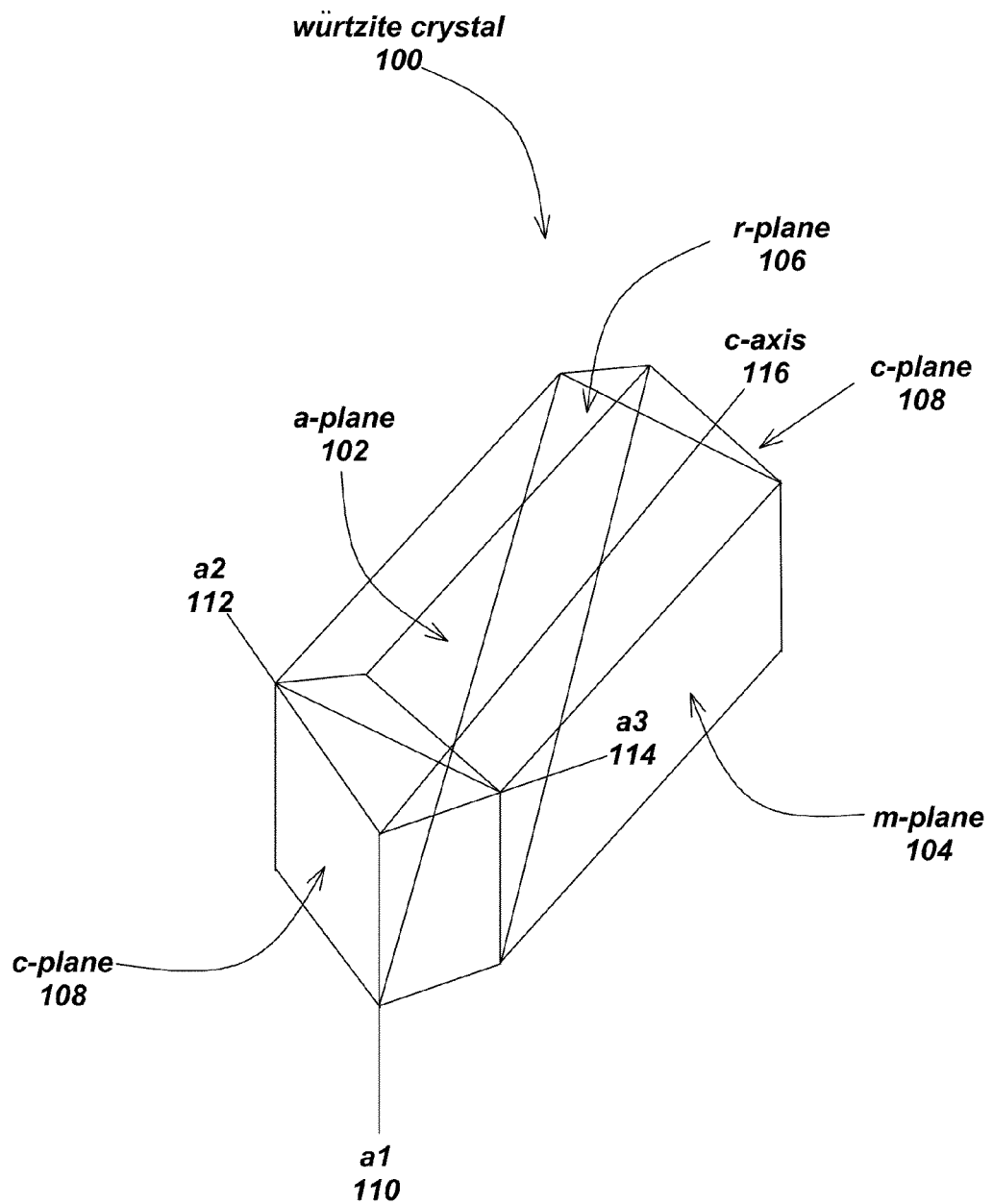
FIG. 1 is a schematic of a generic hexagonal structure and planes of interest with these axes identified therein.
Figure 2:
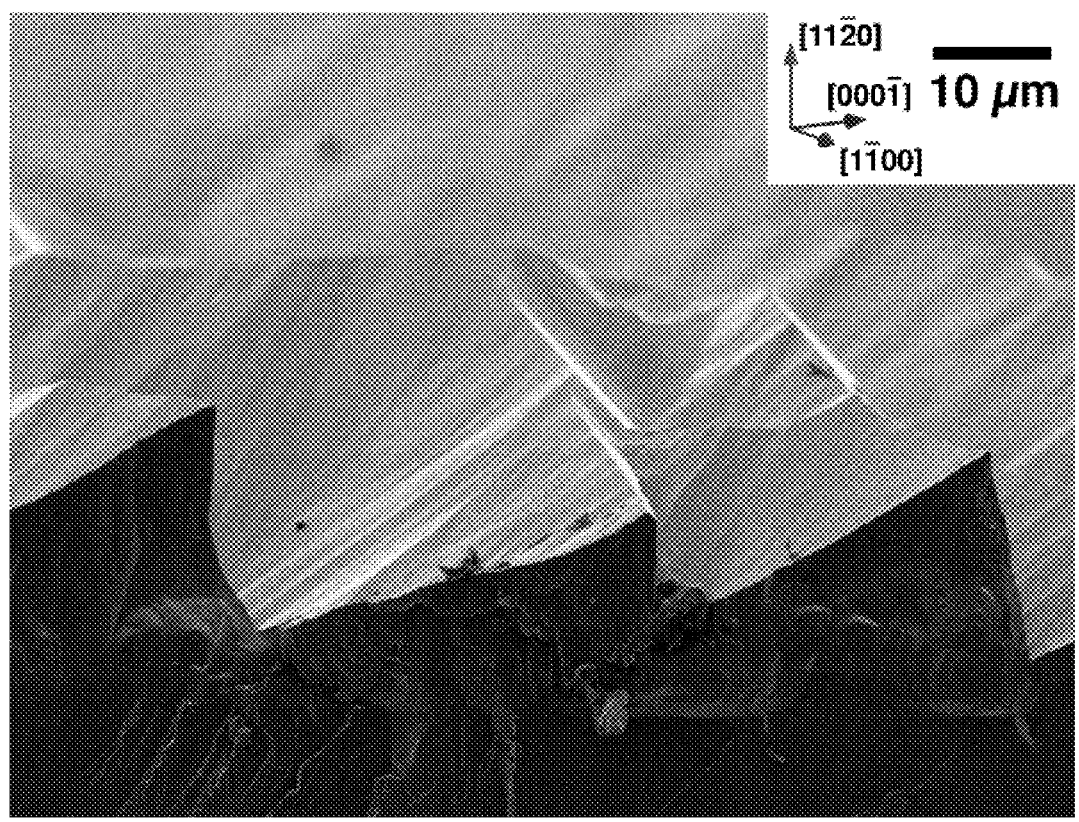
FIG. 2 is a cross-sectional scanning electron micrograph (SEM) image of a conventionally-grown a-plane GaN film exhibiting a sawtooth morphology.
Figure 3:
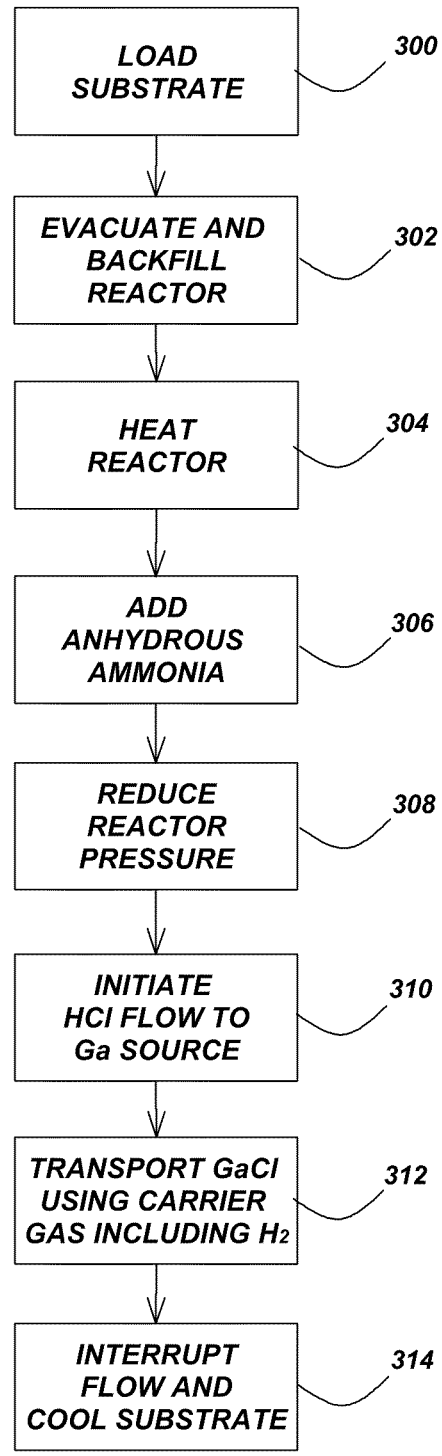
FIG. 3 is a flowchart that illustrates the steps of the process according to the preferred embodiment of the present invention.

FIG. 3 is a flowchart that illustrates the steps of the process according to the preferred embodiment of the present invention. These steps comprise a typical growth sequence that yields high-quality, planar, non-polar, a-plane GaN films using a conventional three-zone horizontal directed-flow HVPE system.

Block 300 represents the step of loading a substrate into a reactor without any ex situ cleaning. In the preferred embodiment, the substrate is an r-plane {1$\bar{1}$02} sapphire ($Al_2O_3$) substrate, although other materials, such as silicon carbide (SiC), may be used as well.

Block 302 represents the step of evacuating the reactor and backfilling the reactor with purified nitrogen ($N_2$) gas to reduce oxygen and water vapor levels therein, before heating the reactor. This step is typically repeated to further reduce the oxygen and water vapor presence in the system.

Block 304 represents the step of heating the reactor to a growth temperature of approximately 1040° C., with a mixture of $H_2$ and $N_2$ flowing through all channels in the system.

Block 306 represents the step of nitridating the sapphire substrate, once the reactor reaches the growth temperature, wherein the nitridating step comprises adding anhydrous ammonia ($NH_3$) to a gas stream in the reactor to nitridate the surface of the sapphire substrate. The step of nitridating the substrate is performed at a temperature in excess of 900° C.

Block 308 represents the step of reducing the reactor's pressure to a desired deposition pressure. In the preferred embodiment, the desired deposition pressure is below atmospheric pressure (760 Torr), and more specifically, the desired deposition pressure ranges from 5 to 100 Torr. In embodiment, the desired deposition pressure is approximately 76 Torr.

Block 310 represents the step of initiating a gaseous hydrogen chloride (HCl) flow to a gallium (Ga) source to begin growth of the a-plane GaN film directly on the sapphire substrate without the use of any low-temperature buffer or nucleation layers. Conventional metal source HVPE involves an in situ reaction of a halide compound, such as (but not limited) to, gaseous HCl with the metallic Ga at a temperature in excess of 600° C. to form a metal halide species, such as gallium monochloride (GaCl).

Block 312 represents the step of transporting the GaCl to the substrate by a carrier gas that includes at least a fraction of hydrogen ($H_2$) in one or more of the gas streams in the reactor. The carrier gas may also include nitrogen, helium, or argon. Either in transport to the substrate, at the substrate, or in an exhaust stream, the GaCl reacts with the $NH_3$ to form the GaN film. Reactions that occur at the substrate have the potential to yield the GaN film on the substrate, thereby resulting in crystal growth. Typical V/III ratios (the molar ratio of $NH_3$ to GaCl) are 1-50 for this process. Note that the $NH_3$/HCl ratio need not equal the V/III ratio due to supplemental HCl injection downstream of the Ga source or incomplete reaction of HCl with the Ga source.

Block 314 represents, after a desired growth time has elapsed, the step of interrupting the gaseous HCl flow, returning the reactor pressure, and reducing the reactor's temperature to room temperature. The interrupting step further comprises including $NH_3$ in a gas stream to prevent decomposition of the GaN film during the reduction of the reactor's temperature. The reactor pressure may be reduced to atmospheric pressure or lower, e.g., wherein the cooling is performed between 5 and 760 Torr.

Typical growth rates for the GaN film range from 1 to 50 μm per hour by this process. These growth rates are dependent on a number of growth parameters, including, but not limited to, the source and substrate temperatures, flow rates of the various gases into the system, the reactor geometry, etc., and can be varied over reasonably wide ranges while still yielding planar a-plane GaN films. The preferred values for most of these parameters will be specific to the growth reactor geometry.

The reference in the process steps above to the "final growth stage" refers to the observation that it is possible to planarize otherwise rough or sawtoothed films by concluding the growth stage with a step of suitable duration using the above-described conditions. The earlier stages of growth may incorporate any growth parameters that yield nominally a-plane oriented material, regardless of film morphology.

Preferably, the above process steps create a planar, nonpolar, a-plane gallium nitride (GaN) film. Moreover, devices manufactured using this method include laser diodes, light-emitting diodes and transistors.

Experimental Results

Figure 4:
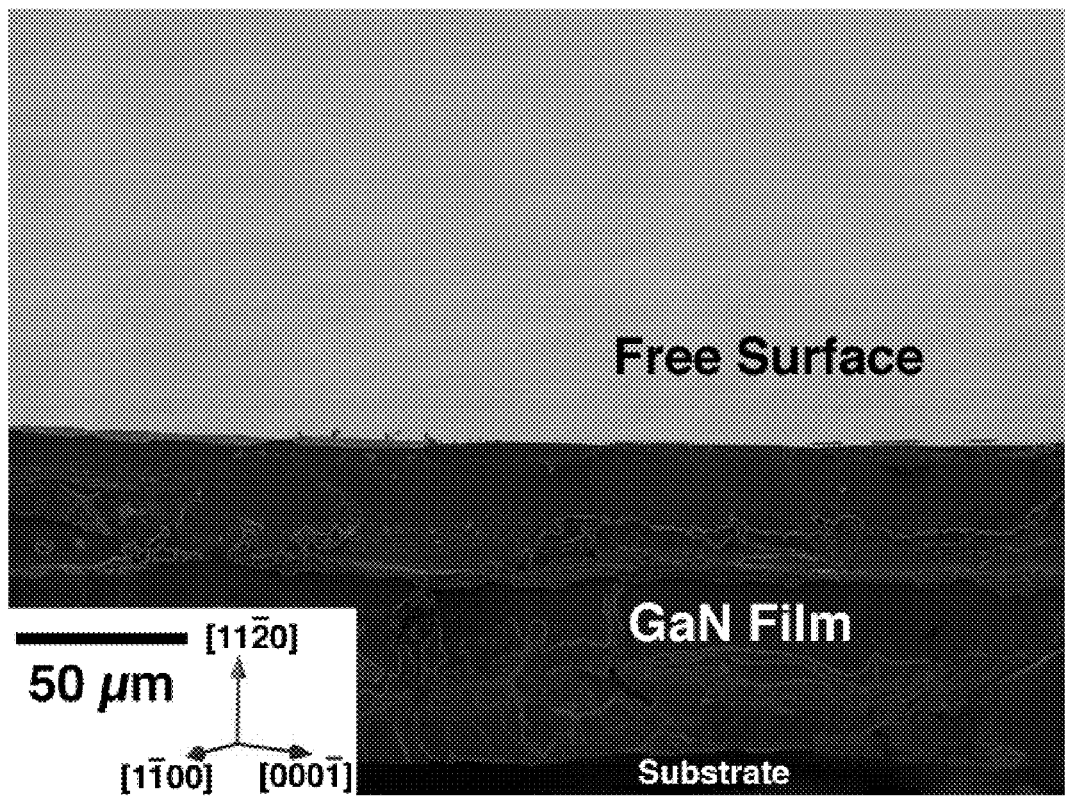
FIG. 4 is a cross-sectional scanning electron micrograph (SEM) image of an a-plane gallium nitride film grown using the techniques described by the present invention.

In experiments by the inventors, the above process consistently yields specular, planar a-plane GaN films. FIG. 4 is a cross-sectional SEM image of an a-plane GaN film grown using the techniques described by the present invention. Note the highly planar upper free surface shown in FIG. 4. (Note also that the striated cross-section surface is an artifact of cleaving.)

Figure 5:
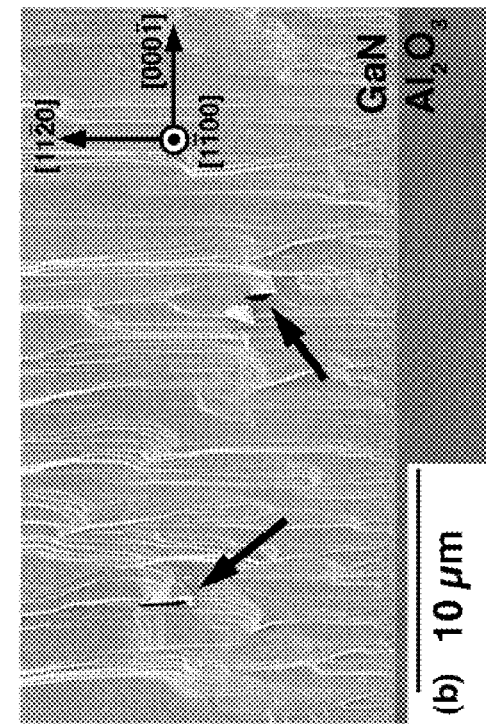
FIG. 5(a) shows an optical contrast micrograph of a representative a-plane GaN film grown by hydride vapor phase epitaxy (HVPE)
FIG. 5(b) shows a cross-sectional scanning electron (SEM) micrograph of sub-surface, internal cracks.
Figure 5:
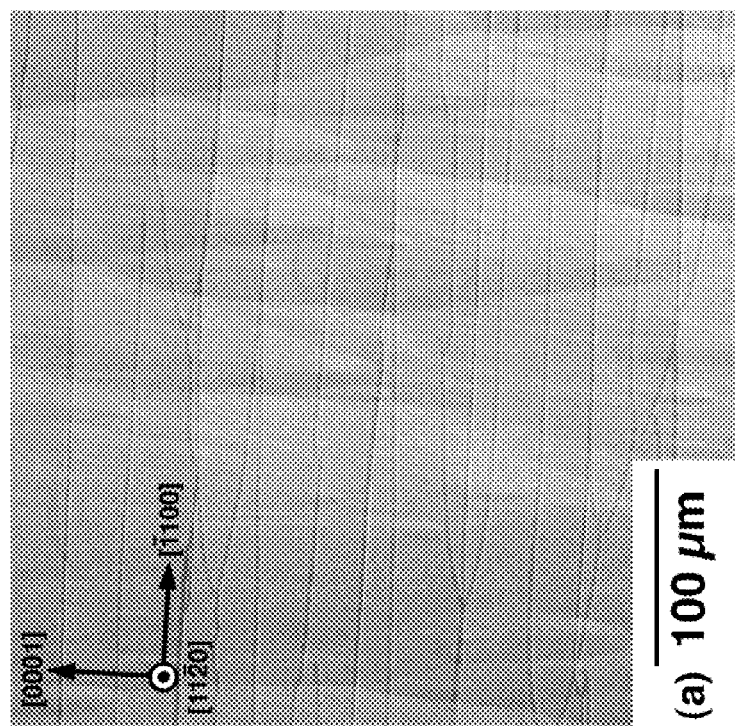

FIG. 5(a) shows a Nomarski™ optical contrast micrograph of a representative a-plane GaN film grown by HVPE. The ($11\bar{2}0$) GaN films are specular and optically transparent, with little detail of the surface being apparent in conventional transmission or reflection optical microscopy. The surface is characterized by long-range 'flow' patterns that have peak-to-valley heights on the order of 500 nm over 75+μm lateral extent, as measured by profilometry. Light scattering and refractive index contrast allow observation of sub-surface cracks oriented nearly perpendicular to the GaN c-axis.

FIG. 5(b) shows a cross-sectional scanning electron (SEM) micrograph detailing two such cracks. With few exceptions, these internal cracks, which are similar to those observed in c-plane GaN films (see Reference 17), did not reach the free surface during growth. However, 50+μm-thick films have exhibited cracks that propagate to the surface. These cracks result from plastic relief of tensile strain that may be a consequence of grain coalescence. (See Reference 18.) The cracks subsequently heal via local lateral overgrowth to reduce surface energy.

Figure 6:
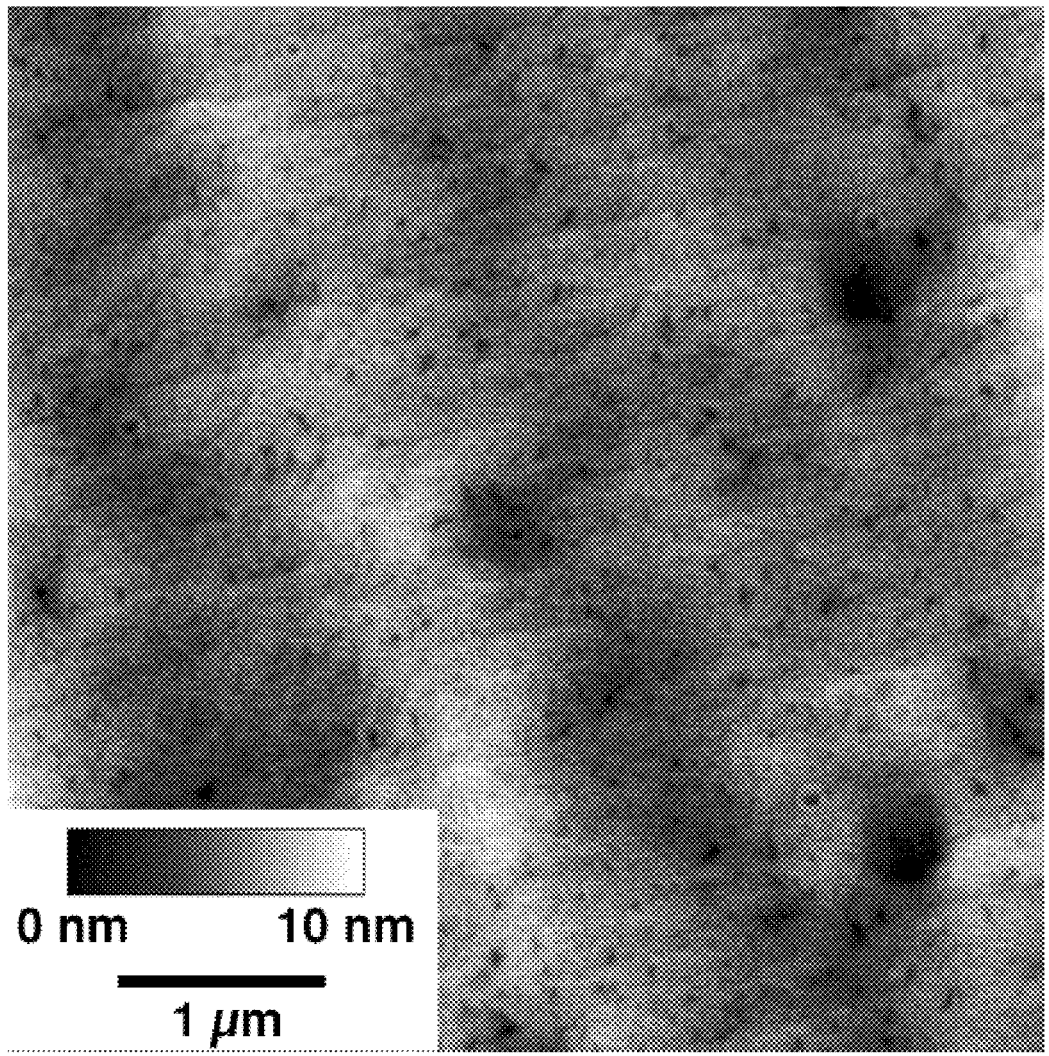
FIG. 6 shows a representative atomic force micrograph (AFM) from an a-plane GaN film.

Atomic force microscopy (AFM) was conducted on the planar a-GaN surfaces in tapping mode using a Digital Instruments D3100™ atomic force microscope. FIG. 6 shows a representative atomic force micrograph from an a-plane GaN film. Local root-mean-square (RMS) roughness over 2×2 μm sampling areas was typically <0.8 nm. The RMS roughness over larger sampling areas (10-20 μm) remained below 2 nm. The surface was dominated by a high density of nanometer-scale pits that have depths of 3-7 nm. These pits likely decorated threading dislocation terminations at the free surface. The observed surface pit density generally ranged from $2\times10^9$ to $9\times10^9$ $cm^{-2}$. Additionally, ~1 nm high steps oriented roughly perpendicular to the GaN c-axis were apparent in the AFM image.

Structural characteristics of the planar a-plane GaN films were evaluated by x-ray diffraction (XRD) and plan-view transmission electron microscopy (TEM). XRD was performed using Cu Kα radiation in a Philips MRD Pro™ four-circle x-ray diffractometer operating in receiving slit mode. ω-2θ scans of the a-GaN films exhibited peaks that were indexed to the r-plane sapphire ($1\bar{1}02$), ($2\bar{2}04$), and ($3\bar{3}06$) reflections, and the ($11\bar{2}0$) GaN reflection. No GaN (0002) reflection was observed, demonstrating that within the detection limits of this technique, the films were uniformly a-plane-oriented. ω rocking curves were measured on the on-axis ($11\bar{2}0$) reflection for geometries in which the GaN [$\bar{1}100$] and [0001] directions were in a coplanar geometry. Typical full widths at half maximum (FWHM) for the ($11\bar{2}0$) reflection in these geometries were 1040-1045 arcsec. The 30° off-axis ($10\bar{1}0$) reflection was measured by tilting the samples relative to the scattering plane (skew geometry), yielding a FWHM on the order of 3000 arcsec. The on-axis peak width was comparable to that observed for planar MOCVD-grown a-plane GaN films (see Reference 19), while the off-axis peak width was roughly twice as large, indicating a more defined cell structure and higher mosaic content in the HVPE-grown films. (See Reference 20.)

Figure 7:
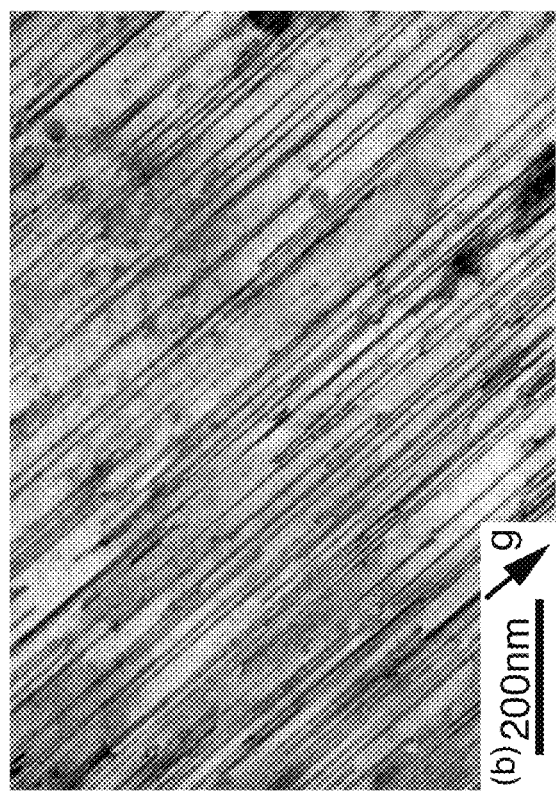
FIGS. 7(a) and (b) show plan-view transmission electron micrographs (TEMs) of an a-plane GaN film.
Figure 7:
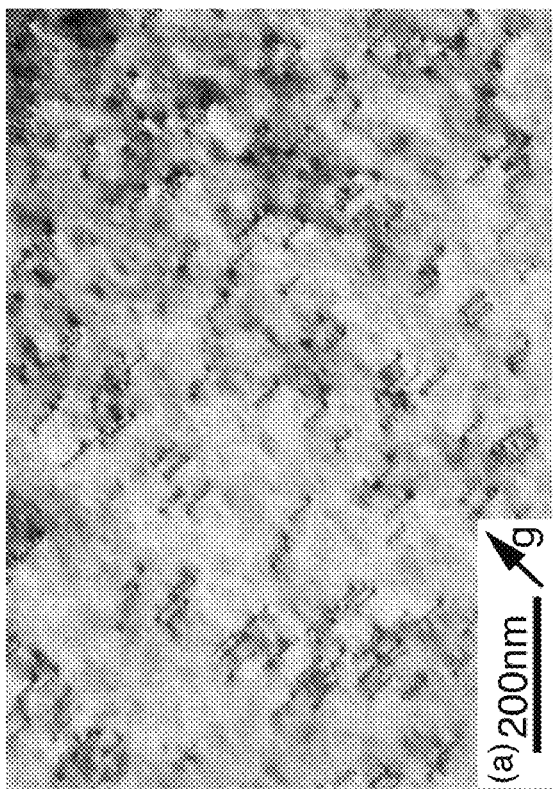

FIG. 7 shows plan-view transmission electron micrographs of an a-plane GaN film. FIG. 7(a) was imaged under the g=0002 diffraction condition, revealing threading dislocations having a Burgers vector component parallel to the GaN [0001] direction. Thus, these are edge component dislocations. The c-component dislocation density ranged from $9\times10^9$ cm$^{-2}$ to $2\times10^{10}$ cm$^{-2}$ in these samples in agreement with AFM pit density measurements and TEM of MOCVD-grown a-plane GaN films. (See Reference 19.) The TEM image in FIG. 7(b), taken under the g=1100 diffraction condition, shows a stacking fault density of ~$4\times10^5$ cm$^{-1}$, again comparable with the $3.8\times10^5$ cm$^{-1}$ observed for planar MOCVD-grown a-plane GaN films. (See Reference 19.) These basal-plane stacking faults are likely related to the presence of exposed nitrogen-face (000$\bar{1}$) surfaces during the early stages of growth. Additional imaging with varying sample tilt in the g=1$\bar{1}$00 diffraction condition revealed ~$7\times10^9$ cm$^{-2}$ Shockley partial dislocations having Burgers vectors $$b = \frac{1}{3} < 1\bar{1}00 >.$$

REFERENCES

The following references are incorporated by reference herein:

1. T. Nishida and N. Kobayashi, Phys. Stat. Sol. (a), 188 (1), 113 (2001).
2. S, Nakamura, G. Fasol, and S. J. Pearton, *The Blue Laser Diode*. New York: Springer, 2000.
3. L. F. Eastman and U. K. Mishra, IEEE Spectrum, 39 (5), 28 (2002).
4. T. Takeuchi, C. Wetzel, S. Yamaguchi, H. Sakai, H. Amano, I. Akasaki, Y. Kaneko, S, Nakagawa, Y. Yamaoka, and N. Yamada, Appl. Phys. Lett. 73 (12) 1691 (1998).
5. I. Jin Seo, H. Kollmer, J. Off, A. Sohmer, F. Scholz, and A. Hangleiter, Phys. Rev. B, 57 (16) R9435 (1998).
6. R. Langer, J. Simon, V. Ortiz, N. T. Pelekanos, A. Barski, R. Andre, and M. Godlewski, Appl. Phys. Lett., 74 (25) 3827 (1999).
7. P. Lefebvre, J. Allegre, B. Gil, H. Mathieu, N. Grandjean, M. Leroux, J. Massies, and P. Bigenwald, Phys. Rev. B, 59 (23) 15363 (1999).
8. P. Lefebvre, A. Morel, M. Gallart, T. Taliercio, J. Allegre, B. Gil, H. Mathieu, B. Damilano, N. Grandjean, and J. Massies, Appl. Phys. Lett., 78 (9) 1252 (2001).
9. P. Waltereit, O. Brandt, A. Trampert, H. T. Grahn, J. Menniger, M. Ramsteiner, M. Reiche, and K. H. Ploog, Nature (London), 406, 865 (2000).
10. M. D. Craven, P. Waltereit, F. Wu, J. S. Speck, and S. P. DenBaars, Accepted for Publication.
11. H. M. Ng, Appl. Phys. Lett., 80 (23) 4369 (2002).
12. K. Motoki, T. Okahisa, N. Matsumoto, M. Matsushima, H. Kimura, H. Kasai, K. Takemoto, K. Uematsu, T. Hirano, M. Nakayama, S, Nakahata, M. Ueno, D. Hara, Y. Kumagai, A. Koukitu, and H. Seki, Jpn. J. Appl. Phys. Part 2, 40 (2B), L140 (2001).
13. T. Paskova, P. P. Paskov, V. Darakchieva, S. Tungasmita, J. Birch, and B. Monemar, Phys. Stat. Sol. (a) 183 (1) 197 (2001).
14. A. Shintani and S. Minagawa, J. Electrochem. Soc. 123 (10) 1575 (1976).
15. B. Monemar, O. Lagerstedt, and H. P. Gislason, J. Appl. Phys. 51 (1) 625 (1980).
16. M. Sano and M. Aoki, Jpn. J. Appl. Phys. 15 (10) 1943 (1976).
17. E. V. Etzkorn and D. R. Clarke, J. Appl. Phys., 82 (2) 1025 (2001).
18. T. Böttcher, S. Einfeldt, S. Figge, R. Chierchia, H. Heinke, D. Hommel, and J. S. Speck, Appl. Phys. Lett., 78 (14) 1976 (2001).
19. M. D. Craven, S. H. Lim, F. Wu, J. S. Speck, and S. P. DenBaars, Appl. Phys. Lett., 81 (3) 469 (2002).
20. B. Heying, X. H. Wu, A. S. Keller, Y. Li, D. Kapolnek, B. P. Keller, S. P. DenBaars, and J. S. Speck, Appl. Phys. Lett., 68, 643 (1996).

CONCLUSION

This concludes the description of the preferred embodiment of the present invention. The following describes some alternative embodiments for accomplishing the present invention.

The preferred embodiment describes a direct growth process in which the a-plane GaN is grown directly off of the sapphire substrate. Alternative suitable substrate materials including, but not limited to, a-plane silicon carbide, or particular gallate or aluminate ceramic crystals, may be used in practice of this invention.

HVPE growth of c-plane GaN is frequently carried out by using a thin GaN "template" layer that is pre-deposited on a suitable substrate by another growth technique, such as MOCVD, MBE, or HVPE. The use of templates for subsequent HVPE regrowth has been established as a viable technique for practicing the present invention.

The present invention can be used to manufacture free-standing a-plane GaN films or substrates. In some cases, it may be desirable to use such free-standing GaN films or substrates as "template" layers for the present invention.

The preferred embodiment describes an HVPE-based growth process utilizing a reaction between metallic gallium (Ga) and gaseous hydrogen chloride (GaCl) as the Group III source. Alternative Group III sources, such as but not limited to, gallium trichloride (GaCl$_3$), or alternative reactive gases, such as but not limited to, hydrogen bromide (HBr), may be used in the practice of this invention without fundamentally altering the method.

Nucleation layers deposited at either low temperatures or at or above the growth temperature by a variety of growth techniques may also be used for subsequent regrowth by HVPE using the present invention.

Those skilled in the art may prefer to alter the carrier gas composition during heating or modify/omit the nitridation step described above. Such modifications do not fundamentally affect the practice of the present invention described herein.

Reactor geometry and design may affect the practice of the present invention. In general, exact flow rates of the various constituent gases have been omitted in the descriptions above because optimal flow rates are highly dependent on reactor design.

The typical growth rates used in the preferred embodiment are 1 to 50 μm/hour. However, the inventors have demonstrated that a-plane GaN growth rates in excess of 200 μm/hour are possible. The use of growth rates outside of the preferred range does not fundamentally alter the practice of the invention.

The critical parameters for the practice of this invention are the growth pressure, the presence of hydrogen in the carrier gas stream, a growth temperature in the range of 800-1300° C., gas velocity over the substrate (which is again reactor-dependent) and the use of a suitable substrate. Other factors, including but not limited to V/III ratio, precise carrier gas composition, and precursor partial pressures may be varied significantly while still achieving the desired planar a-plane GaN films.

Finally, the processes described herein may be scaled for multiple wafer growth. Specifically, the present invention may be practiced through the growth of films on multiple wafers simultaneously.

In summary, the present invention describes the application of low-pressure growth utilizing hydrogen in the carrier gas stream to enable the growth of fully planar a-plane GaN films by HVPE. The resulting films are suitable for subsequent device regrowth by a variety of growth techniques.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating Group-III nitride, comprising: growing one or more non-polar Group-III nitride layers on a surface of a substrate using vapor phase epitaxy, including;
(a) transporting a Group III-source to the surface of the substrate using one or more carrier gates, wherein the Group III source reacts with a nitrogen precursor at a surface of the substrate to grow the non-polar Group-III nitride layers,
(b) selecting one or more growth pressures, the one or more carrier gases, one or more growth temperatures, and one or more gas velocities, wherein;
the non-polar Group-III nitride layers have a grown top surface that is planar and a non-polar plane, with a root mean square roughness, as grown, below 0.8 nanometers over a sampling area of at least 2 by 2 micrometers, and
the non-polar Group III-nitride layers comprise a laser diode, light emitting diode, or transistor structure.

2. The method of claim 1, wherein the substrate, or a film between the substrate and the non-polar Group III-nitride layers, contains a dissimilar material to the non-polar Group III-nitride layers.

3. The method of claim 1, wherein the substrate is free-standing gallium nitride (GaN), aluminum nitride (AlN), or aluminum gallium nitride (AlGaN).

4. The method of claim 1, wherein the substrate is coated with a nucleation layer or a film of gallium nitride (GaN), aluminum nitride (AlN), or aluminum gallium nitride (AlGaN) and the non-polar Group-III nitride layers are grown on the film or the nucleation layer.

5. The method of claim 1, wherein;
the non-polar Group-III nitride layers' top surface is grown using a fraction of hydrogen ($H_2$) in the carrier gases, and
the non-polar Group-III nitride layers' top surface is grown using a reduced reactor pressure below atmospheric pressure.

6. A Group-III nitride film or substrate fabricated using the method of claim 1.

7. The method of claim 1, wherein the top surface is an a-plane.

8. The method of claim 1, wherein the non-polar Group-III nitride layers have a thickness that is sufficient to form a free-standing substrate.

9. The method of claim 1, wherein the non-polar Group-III nitride layers have a thickness of at least 200 micrometers.

10. The method of claim 1, wherein the non-polar Group-III nitride layers are GaN layers.

11. A device, comprising;
one or more non-polar III-nitride layers having a top surface that is a planar and a non-polar plane, as grown, wherein;
the top surface has a root mean square roughness, as grown, below 0.8 nanometers over a sampling area of at least 2 by 2 micrometers, and
the non-polar Group III-nitride layers comprise a laser diode, light emitting diode, or transistor structure.

12. The device of claim 11, wherein the non-polar III-nitride layers have a thickness of at least 200 micrometers.

13. The device of claim 11, wherein the non-polar III-nitride layers, are a-plane layers and the non-polar plane is an a-plane.

14. The device of claim 11, wherein the non-polar III-nitride layers, comprise GaN.

15. The device of claim 11, wherein the non-polar Group III-nitride layers are grown on a substrate and the substrate contains a dissimilar material to the non-polar Group III-nitride layers.

16. The device of claim 11, wherein the non-polar Group-III nitride layers are grown on free-standing gallium nitride (GaN), aluminum nitride (AlN), or aluminum gallium nitride (AlGaN).

17. The device of claim 11, wherein the non-polar Group-III nitride layers form different Group-III-nitride films.

18. The device of claim 11, wherein:
the top surface has pits decorating threading dislocation terminations and a pit density of no more than $2\times10^9$ $cm^{-2}$ to $9\times10^9$ $cm^{-2}$, and
the top surface has a root mean square roughness, as grown, below 2 nanometers over a sampling area of at least 10-20 by 10-20 micrometers.

19. The method of claim 1, wherein the non-polar Group-III nitride layers form different Group-III-nitride films.

20. The method of claim 1, wherein:
the top surface has pits decorating threading dislocation terminations and a pit density of no more than $2\times10^9$ $cm^{-2}$ to $9\times10^9$ $cm^{-2}$, and
the top surface has a root mean square roughness, as grown, below 2 nanometers over a sampling area of at least 10-20 by 10-20 micrometers.

21. The method of claim 1, wherein the growing is by Hydride Vapor Phase Epitaxy (HVPE).

22. The method of claim 1, further comprising growing the non-polar Group III nitride layers at a growth rate greater than 200 micrometers per hour.

* * * * *